(12) United States Patent
Martinez et al.

(10) Patent No.: US 8,587,328 B2
(45) Date of Patent: Nov. 19, 2013

(54) AUTOMATIC CHARACTERIZATION OF AN ACTUATOR BASED ON CAPACITANCE MEASUREMENT

(75) Inventors: Eduardo Martinez, Valencia (ES); Christian Jimenez, Valencia (ES); Jose Ibanez-Climent, Valencia (ES); Colm Donovan, Valencia (ES)

(73) Assignee: Analog Devices, Inc., Norwood, MA (US)

( * ) Notice: Subject to any disclaimer, the term of this patent is extended or adjusted under 35 U.S.C. 154(b) by 405 days.

(21) Appl. No.: 12/860,063

(22) Filed: Aug. 20, 2010

(65) Prior Publication Data

US 2011/0050252 A1    Mar. 3, 2011

Related U.S. Application Data

(60) Provisional application No. 61/236,691, filed on Aug. 25, 2009.

(51) Int. Cl.
| | |
|---|---|
| G01R 27/26 | (2006.01) |
| G01R 27/08 | (2006.01) |
| H02P 7/00 | (2006.01) |
| H02P 3/00 | (2006.01) |
| G01L 25/00 | (2006.01) |

(52) U.S. Cl.
USPC ........... 324/658; 324/671; 324/686; 324/662; 324/695; 318/468; 318/283; 702/115

(58) Field of Classification Search
USPC ................................................. 324/650, 658
See application file for complete search history.

(56) References Cited

U.S. PATENT DOCUMENTS

| | | | | |
|---|---|---|---|---|
| 2,872,638 | A | * | 2/1959 | Jones ............................ 324/365 |
| 3,042,859 | A | * | 7/1962 | Shillington ................... 324/677 |
| 4,311,080 | A | * | 1/1982 | Leonard ............................ 87/44 |
| 5,023,559 | A | * | 6/1991 | Andermo ....................... 324/662 |
| 5,028,876 | A | * | 7/1991 | Cadwell ........................ 324/678 |
| 5,455,723 | A |   | 10/1995 | Boutaghou et al. |
| 5,563,483 | A | * | 10/1996 | Kowall et al. ................. 318/283 |
| 5,880,565 | A |   | 3/1999 | Watanabe |
| 6,133,714 | A | * | 10/2000 | Hoffmann et al. ............ 320/166 |
| 6,349,705 | B1 | * | 2/2002 | Pirkl et al. ..................... 123/490 |
| 6,396,368 | B1 |   | 5/2002 | Chow et al. |
| 6,525,446 | B1 |   | 2/2003 | Yasuda et al. |

(Continued)

OTHER PUBLICATIONS

International Search Report dated Nov. 3, 2010, in counterpart International application No. PCT/US2010/046605.

*Primary Examiner* — Jermele M Hollington
*Assistant Examiner* — Christopher McAndrew
(74) *Attorney, Agent, or Firm* — Kenyon & Kenyon LLP

(57) ABSTRACT

An apparatus and method for determining characterizing attributes of an actuator is provided. An actuator may be moved to a maximum capacitance position. At the maximum capacitance position, an initial measurement of the actuator capacitance is made. The actuator is moved a predetermined increment toward a first extreme position, and the actuator capacitance is again measured. If the capacitance changed by a threshold amount, the signal preceding the signal that caused the actuator to move is recorded as an approximate response curve end point, or the first extreme position. The actuator is again moved a predetermined increment toward a second extreme position. After each move, the capacitance is measured. If it is determined the capacitance did change by a threshold amount from the previously measured capacitance, the signal related to the previously measured capacitance is recorded as an approximate response curve end point, or the second extreme position.

19 Claims, 6 Drawing Sheets

(56) References Cited

U.S. PATENT DOCUMENTS

| | | | |
|---|---|---|---|
| 6,577,975 B2 | 6/2003 | Chiesa | |
| 6,710,507 B2 | 3/2004 | Murphy | |
| 6,847,908 B2 | 1/2005 | Chawla | |
| 7,092,196 B2 * | 8/2006 | Eaton et al. | 360/75 |
| 7,126,495 B2 * | 10/2006 | Netzer | 340/870.39 |
| 7,178,397 B2 | 2/2007 | Lee et al. | |
| 7,319,301 B2 * | 1/2008 | Pribisic | 318/468 |
| 7,446,723 B2 * | 11/2008 | Osaka et al. | 343/766 |
| 7,521,921 B2 * | 4/2009 | Zhu et al. | 324/207.17 |
| 7,719,162 B2 | 5/2010 | Min et al. | |
| 2003/0127698 A1 | 7/2003 | Lee | |
| 2003/0133252 A1 | 7/2003 | Fasen | |
| 2004/0008097 A1 | 1/2004 | Ma et al. | |
| 2006/0006883 A1 | 1/2006 | Foote | |
| 2006/0115920 A1 | 6/2006 | Urano et al. | |
| 2006/0267385 A1 * | 11/2006 | Steenwyk et al. | 297/217.1 |
| 2007/0067127 A1 | 3/2007 | Bolz | |
| 2008/0151464 A1 | 6/2008 | Ellis et al. | |
| 2008/0319699 A1 * | 12/2008 | Perryman | 702/115 |
| 2009/0096468 A1 * | 4/2009 | Hirota et al. | 324/681 |

* cited by examiner

100

300

US 8,587,328 B2

AUTOMATIC CHARACTERIZATION OF AN ACTUATOR BASED ON CAPACITANCE MEASUREMENT

This application claims priority to U.S. Provisional Patent Application Ser. No. 61/236,691 filed on Aug. 25, 2009, the entire contents of which are incorporated herein by reference.

BACKGROUND

The present invention relates to an actuator that actuates based upon an applied signal. In particular, it relates to determining the characteristics of the actuator to more precisely control the duration and magnitude of the actuation signal.

Actuators are devices that move in response to an applied signal. An example of an actuator is a microelectromechanical (MEM) device, which may be used in auto-focus cameras. MEM actuators also possess a characteristic capacitance that changes based on the actuators displacement. The response (e.g., 'the displacement') of the actuator to the applied voltage may be non-linear. Transfer functions may be derived that may be used in the linearization of the response of the actuator. In deriving the transfer function of an actuator, common end points related to, for example, the voltage related to the maximum displacement and an offset voltage related to the minimum displacement are frequently predetermined for the type of actuator to be used, and are pre-programmed into a microprocessor that controls the system. A microprocessor using the pre-programmed voltages and inputs from sensors can derive a response curve for the attached actuator. The preprogrammed offset voltage value and maximum displacement voltage value form a response curve. These values may be stored in a look up table.

The type of actuator with which the control and driving circuit is going to be used is commonly known ahead of time. However, the response curve of the actuator varies based on the type of actuator, as well as time, temperature and orientation of the actuator (e.g., when the device is held horizontally versus being held vertically). Therefore, complex calibration and temperature sensors are typically needed to provide an accurate linearization of the actuator response. Due to the need for a microprocessor, the complexity of the measurement system needed to provide the linear characterization of an actuator is prohibitive.

There is a need for an integrated circuit chip that is capable of determining the maximum displacement and offset voltages as well as other relevant information usable to characterize an actuator without the need for providing pre-programmed values or a microprocessor or regard for determining a time, an environmental temperature or device orientation.

DETAILED DESCRIPTION

Embodiments of the present invention provide a method for tuning an actuator controller. The actuator controller may be tuned by driving an actuator to a first stop position by a driving signal. The driving signal may be incrementally adjusted to drive the actuator to a second stop position and actuator capacitance may be measured until a measured capacitance of the actuator indicates the actuator has moved from the first stop position. A code associated with a recently adjusted driving signal in the actuator controller may be stored after the incremental adjustment.

Another embodiment provides on an integrated circuit chip an apparatus for determining characterizing attributes of an actuator. The on-chip apparatus may include a memory device, a capacitance sensor, control logic and an actuator driver on the integrated circuit chip. The memory device may store and may provide values in response to signals from the control logic. The capacitance sensor may include circuitry for determining a signal representative of the capacitance of the actuator. The actuator driver may have an output connected to the actuator for providing actuating signals to the actuator, and may have inputs for receiving actuator drive signals from the control logic and feedback from the actuator. The control logic may be configured to send signals to the actuator driver that may cause the actuator to move, receive signals from the capacitance sensor, determine if the capacitance of the actuator has changed by a first threshold amount, and if the capacitance has changed by the first threshold amount, may cause a value of the signal related to the determined capacitance change to be stored in the memory device. The apparatus or components comprising the apparatus may in other embodiments be located remote from the integrated circuit chip, or, in other words, off-chip.

Figure 1:
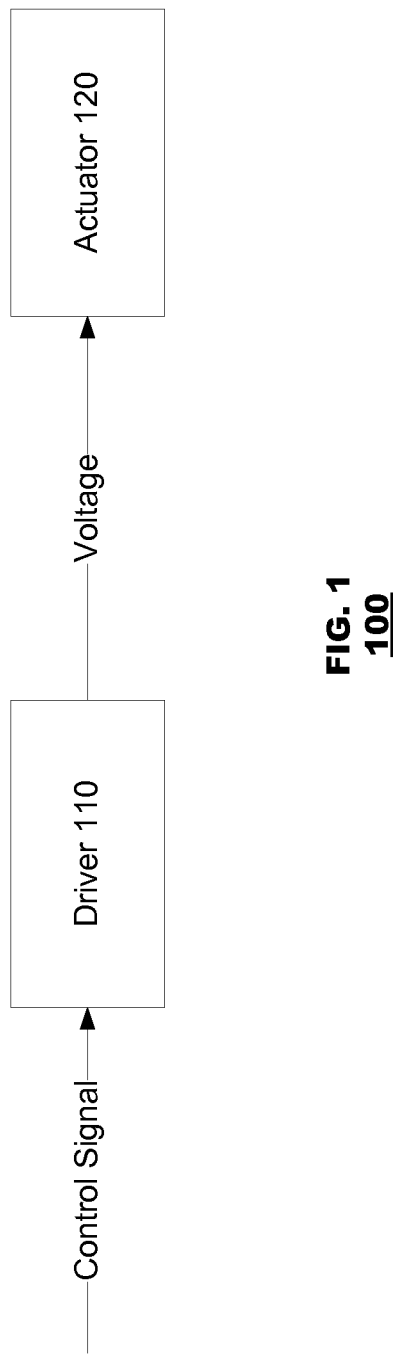
FIG. 1 illustrates an exemplary system according to an embodiment of the present invention.

FIG. 1 illustrates an exemplary system for controlling an actuator. The exemplary system 100 may include a driver circuit 110 and an actuator 120. An example of an actuator 120 may be a MEM structure.

The driver circuit 110 may respond to a control signal, which may be an analog voltage (e.g. 1.2 volts) or a digital code word (e.g., a 10 bit code such as 1100110011), by outputting a voltage representation of the control signal to the actuator 120.

The driver circuit 110 may include amplifier circuits that amplify the input analog voltage and apply the amplified voltage to the actuator 120. Or, in the case of a digital control word, include circuitry for converting the digital control word to an analog voltage that is applied to the actuator 120.

The actuator 120 in response to the applied voltage may move a distance corresponding to the applied voltage signal. The actuator 120 may have a capacitance that reflects the displacement of the actuator 120, and the capacitance can be used to characterize the response of the actuator to the applied voltages. In a MEMS application, for example, the capacitance may be measured between a beam of an actuator and a sensor electrode located on a base beneath the beam.

A transfer function can be derived based on the characteristics of the actuator response to applied voltages. Characteristics, such as the voltage values that cause the maximum displacement and the minimum displacement of an actuator, may be used in the transfer function. Using the transfer function, a response curve can be derived for a range of voltages.

Figure 2:
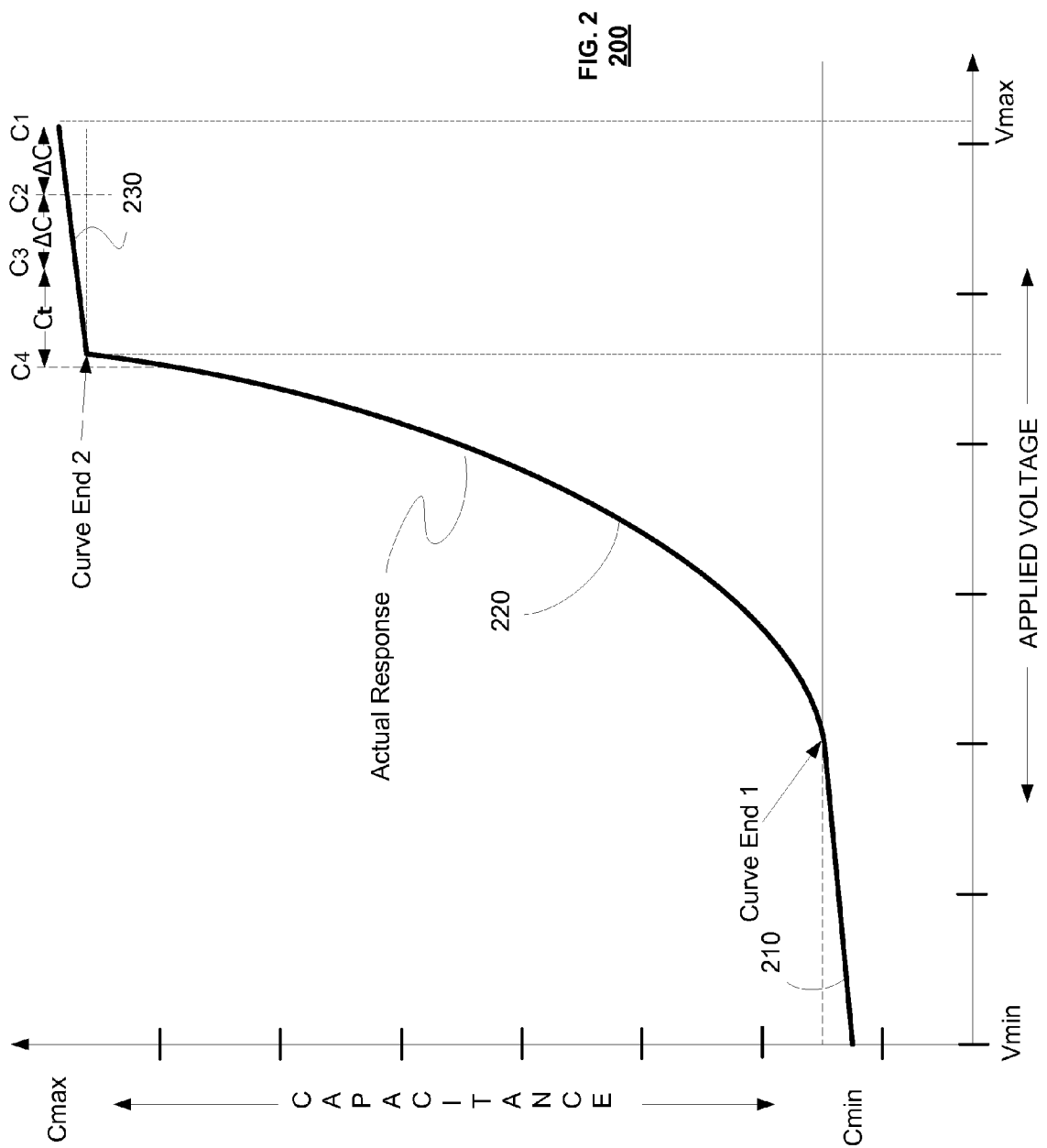
FIG. 2 illustrates an exemplary actuator response curve according to an embodiment of the present invention.

FIG. 2 illustrates an exemplary actuator response curve according to an embodiment of the present invention. The response curve is shown as a segmented curve in which a first segment 210 represents capacitance of an actuator at a first terminal end of the actuator's range of motion, a second segment 220 represents actuator response through the actuator's range of motion and a third segment 230 represents actuator displacement at a second terminal end of its range of motion. For example, in operation, MEMS devices typically move between two mechanical stop positions—an undeflected rest position and a maximum displacement position where a MEMS beam engages a mechanical contact. The curves 210, 230 reflect exemplary capacitance curves that may occur in a MEMS device when the MEMS beam is located at the respective mechanical stop positions.

Simulations suggest that portions 210, 230 of the response curve 200 that are associated with mechanical stop positions will exhibit much lower changes in capacitance than the portion 220 associated with free space displacement of the actuator. Other simulations indicated that the portions 210, 230 were flat, with almost no change in capacitance when the actuator was located at the mechanical stops. The portions 210, 230 are illustrated as being linear but response curves need not be linear in all cases. For the purposes of the present invention, it is sufficient to note that the response curve appears generally segmented with stronger capacitance variations in the free displacement portion (actual response) 220 of the curve 200 than the mechanical stop portions 210, 230 of the curve 200. Embodiments of the present invention exploit such capacitance variations to identify control values corresponding to the mechanical stop positions.

The response curve 200 has two axes: capacitance and voltage. In order for the actuator to respond with any displacement (movement), a voltage, such as Vmax, must be applied to the actuator. The applied voltage may be a minimum voltage, such as Vmin.

In order to characterize the actual actuator response, the values (codes) of the applied voltages for displacing the actuator are typically preprogrammed into an actuator driver. This requires prior knowledge of the applied voltages corresponding to curve end 1 and curve end 2. This apriori knowledge may not always be available, and may limit the drivers that may be used, and/or require preprogramming (or reprogramming) of microprocessors that control the drivers. Accordingly, a minimum driver voltage Vmin may be applied when the voltage corresponding to curve end 1 is not known. Alternatively, a maximum driver voltage Vmax may be applied when the voltage corresponding to curve end 2 is not known.

When determining the actual response curve, the system may take into account the gradual change in capacitance shown in mechanical stop portions 210 and 230. The difference between capacitance values measured from the actuator may be greater in the area of the actual response curve 230 between the curve end 1 and curve end 2 points. Therefore, an actuator controller may use the differences between successive actuator capacitance measurements to determine the curve end points, 1 and 2.

Figure 3:
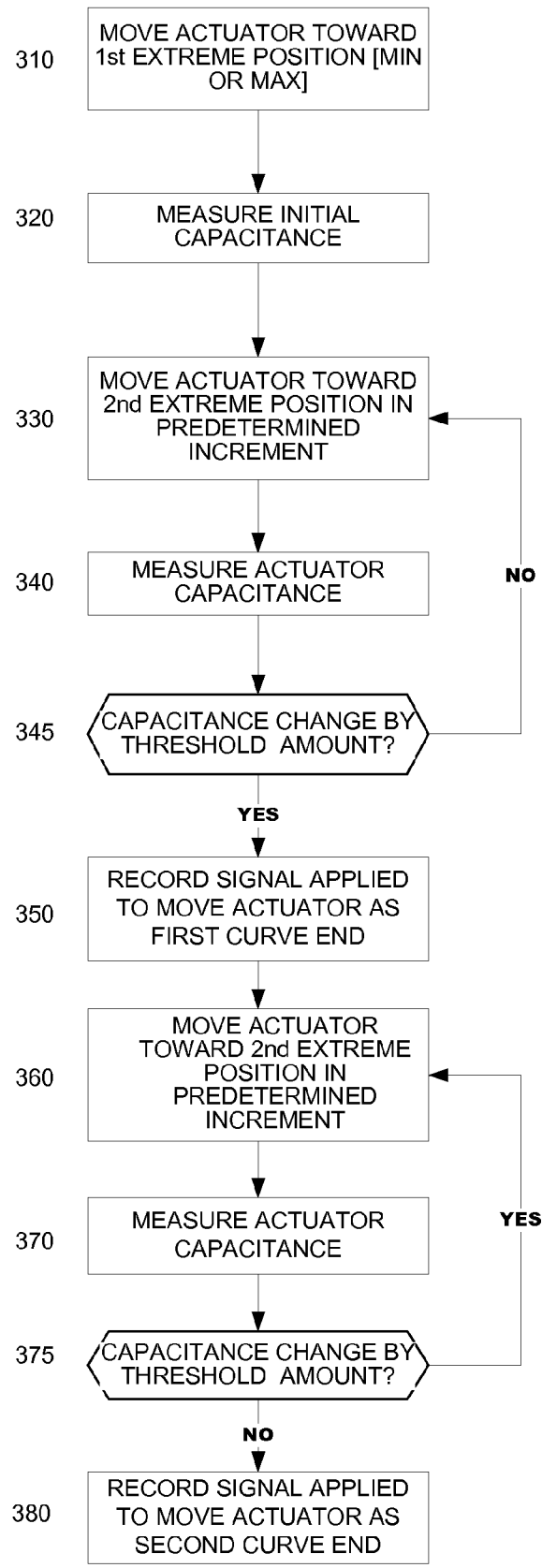
FIG. 3 illustrates an exemplary process flowchart characterizing an actuator according to an embodiment of the present invention.

FIG. 3 illustrates an exemplary method for automatically characterizing an actuator according to an embodiment of the present invention. The process 300 for automatically characterizing an actuator may, in a first embodiment, be implemented with digital logic in a single integrated circuit. The maximum capacitance Cmax shown in FIG. 2 may result when a maximum driver voltage Vmax is applied to the actuator. The maximum driver voltage may cause the furthest displacement of the actuator, and accordingly the maximum capacitance Cmax. Similarly, the minimum capacitance Cmin may be the point of minimum displacement by the actuator and may occur when the minimum driver voltage Vmin is applied to the actuator. The process 300 may begin, for example, as though the actuator has displaced to the maximum capacitance Cmax. At 310, an initial voltage, such as voltage Vmax, may be applied to the actuator to move the actuator to a position related to the maximum capacitance Cmax, or, to a minimum capacitance Cmin (by application of a minimum voltage Vmin), respectively.

At step 320, an initial capacitance, for example, capacitance C1 as shown in FIG. 2, of the actuator may be measured and/or calculated. The measured capacitance value C1 may be stored in a memory device for comparison. At step 330, the actuator may continue to be incrementally moved toward a second extreme position by a predetermined increment 330 by a predetermined voltage value, or stride length.

A stride length (the amount of voltage change between an applied driving voltage and a subsequently applied driving voltage) may be pre-programmed into the driver as a fixed voltage value that is static through the driver's lifecycle. Alternatively, it may be programmed into the driver dynamically, for example, as a value stored into a register of the driver integrated circuit. In one embodiment, the stride length may be tailored to mechanical characteristics of the actuator to avoid ringing—oscillatory behavior of the actuator in response to an incremental voltage change. Stride length may also be a code, e.g., 8 or 16 bits that corresponds to a voltage to be provided to the driver, which converts the code to a voltage that is applied to the actuator.

Actuator capacitance may again be measured at step 340. At each incremental change in the actuator's position caused by application of another applied voltage, the driver may measure the actuator's capacitance. At this stage, the driver may store in memory at least two capacitance values: 1) CAPNEW, the capacitance value obtained at the actuator's current position, and 2) CAPOLD, a capacitance value that was obtained from a prior actuator position. The prior actuator position may be the immediately prior actuator position or another prior actuator position, for example, the actuator position reached in step 310. Each of the CAPNEW and CAPOLD capacitance values correspond to a respective applied voltage value.

Another alternative may be a successive approximation technique in which larger stride lengths are used initially, and gradually reduced by halves of the previous stride length until the approximate location of Curve End 1 (or Curve End 2) is found.

The driver, at step 345, may analyze the measured capacitance to determine if there has been a change in capacitance that exceeds a predetermined estimate of a threshold capacitance Ct. For example, the driver may compare the two capacitance values CAPNEW and CAPOLD to determine if there has been a capacitance change $\Delta C$ between them of more than a threshold capacitance Ct. In an embodiment, the comparison may include an accommodation for a tolerance. For example, a capacitance change may be registered if |CAPNEW−CAPOLD|>Ct (+ERROR), where ERROR may represent a tolerance value that may be preprogrammed. Alternatively, the capacitance measurement may be a coarse measurement incorporating an ERROR tolerance in the measurement itself. If it is determined that the capacitance has NOT changed by the threshold capacitance Ct, the process may return to step 330. Note that steps 330-345 may be performed over a number of iterations. At each iteration of step 330, the applied driving voltage may be changed incrementally to move the actuator toward the Curve End 1. For example, if at step 345 the capacitance change $\Delta C$ is not greater than the threshold capacitance Ct, step 330 may be repeated. In which case, the applied voltage may be changed from Vmax by a stride length voltage ΔV, and the actuator may move closer to Curve End 1. Again the actuator capacitance may be measured, and may have the capacitance value C2, which may be stored. The capacitance difference ΔC between the capacitance C1 and the capacitance C2 may be determined, and compared to a threshold capacitance Ct. In the example of FIG. 2, the capacitance C2 may not exceed the capacitance threshold Ct. The capacitance measurement C1 may be discarded, and another stride length voltage ΔV may be applied, and another capacitance C3 measured and stored. Again a difference capacitance ΔC between measured capacitances C3 and C2 may be determined, and compared to a threshold capacitance Ct.

If it is determined that the capacitance has changed by the threshold capacitance Ct, e.g. the capacitance difference between C3 and C4, the process may continue to step 350. When a change in capacitance is measured, at 350, the driver may store the signal value (or the code) applied to move the actuator. For example, if the difference capacitance ΔC exceeds the threshold capacitance Ct, then the signal value (or code) corresponding to capacitance C3 may be considered the location of the first extreme position, or an end point of the response curve 220, i.e., Curve End 1. Alternatively, once the threshold capacitance Ct has been met or exceeded, a successive approximation technique may be applied using variable stride lengths to more precisely determine the voltage or code that corresponds to a more accurate location of the curve end 1. The stored signal value may be a digital (DAC) code representing the actuator's position as an endpoint of the actuator's response curve 220, or may be an analog voltage value.

The codes representing the CAPNEW actuator position or, alternatively, the code immediately prior to the CAPNEW actuator position may be stored in memory as a the code related to the first extreme position, or curve end 1.

At step 360, the actuator is moved toward the second extreme position, or the opposite end of the response curve, curve end 2. Steps 360-375 may be performed over a number of iterations. At each iteration of step 360, the driving voltage being applied to the actuator may be changed to move the actuator toward the second extreme position. When characterizing the actuator by initially applying the driver voltage Vmax to the actuator, subsequent driving voltages may be decremented from voltage Vmax. Conversely, when characterizing the actuator by initially applying the driver voltage Vmin to the actuator, subsequent driving voltages may be incremented.

Actuator movement again may operate according to a fixed or dynamically assigned stride length, which may be tailored to the type of actuator to avoid ringing.

At each incremental change in the actuator's position (or displacement), the driver may measure the actuator's capacitance. Again, the driver may store at least two capacitance values: 1) CAPNEW, the capacitance value obtained at the actuator's current position, and 2) CAPOLD, a capacitance value obtained from a prior actuator position.

At step 375, the driver may compare a difference of the two capacitance values CAPNEW and CAPOLD and determine if there has been a change greater than the capacitance threshold Ct. Again, the comparison may include an accommodation for tolerance. If it is determined that the capacitance has changed by the capacitance threshold Ct, the process may return to step 360 for another iteration. If it is determined that the capacitance has NOT changed by a capacitance greater than or equal to the capacitance threshold Ct, the process may continue to step 380.

When the change in capacitance is less than the capacitance threshold Ct is measured, the driver, at 380, may store the signal value applied to move the actuator, which may be the digital (DAC) code representing the actuator's position as an endpoint of the actuator's displacement range, or at a second position related to a second extreme position, or, for example, Curve End 2. Alternatively, when actuator characterization is begun by initially applying voltage Vmin to the actuator, the second extreme point may be Curve End 1.

The DAC codes representing the CAPNEW actuator position, or, alternatively, the DAC code immediately prior to the CAPNEW actuator position, may be stored as the extreme position, or end point of the actual response (free displacement) curve 220. The stored DAC codes may indicate the first and second extreme actuator positions that may be used to derive a transfer function of the actuator, such as a MEM device, as the orientation, temperature, and time of use of the device (e.g., a camera or cellphone) in which the actuator is a component changes. Thereby, eliminating a need for look up tables, or components, such as a temperature sensor, and/or complex calibration circuit external to the actuator control device.

Referring back to FIG. 2, similar to the discussion with respect to determining a more precise location of the response curve 220 end point, either Curve End 1 or Curve End 2, techniques such as the variable stride length and successive approximation may be applied to more precisely determine the location of the response curve 220 end points. In addition, as shown with respect to FIG. 3, the slope of the displacement mechanical stop portions 210 and 230 may be less than that of the actual response curve 220. The slope of either mechanical stop portion 210 or 230 may be determined using the difference (change) in capacitance ΔC from one measurement to a next. When ΔC becomes greater than a predetermined slope value, the system may assume that the actuator has moved to the actual response curve 220 of curve 200.

Figure 4:
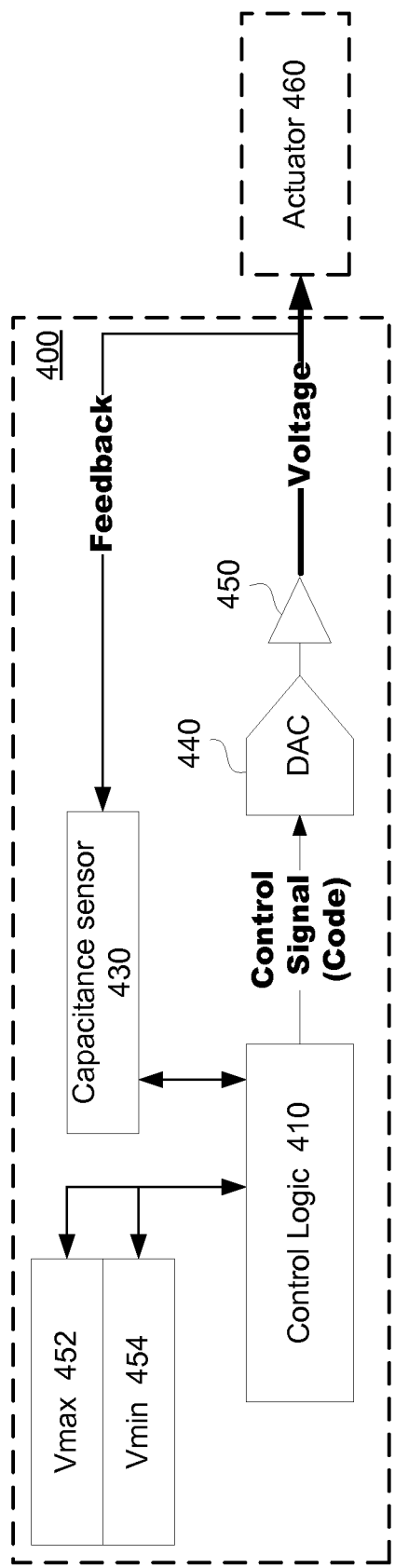
FIG. 4 illustrates a block diagram of a driver circuit according to an embodiment of the present invention.

FIG. 4 illustrates a block diagram of a driver according to an embodiment of the present invention. The driver 400 may be implemented on a single chip, and may include a control logic 410, registers 452, 454, a digital-to-analog converter (DAC) 440, an amplifier 450 and a capacitance sensor 430. The control logic 410 may be a state machine to govern operation of the driver circuit 400, and perform the method of FIG. 3. The control logic 410 may generate a control signal to a DAC to generate a driving voltage to the actuator. In one embodiment, the control signal may be, for example, a 10 bit code. The control logic 410 may read values from and write values to registers 452 and 454 during operation.

The control logic 410 may receive measurements from the capacitance sensor 430 representing capacitance measurements taken of the actuator 460.

Registers 452, 454 may store values representing DAC codes of the derived minimum and maximum displacement values (DACMIN, DACMAX). Optionally, other register(s) may be provided for storage of a dynamically-assigned stride length, amplifier gain, pre-programmed capacitance measurement tolerances, and the like. The programmable features may be stored to the registers 452, 454 from a source external to the driver via an I/O system (not shown). In another embodiment, DAC codes may also be programmable and vary from one asserted code word to the next. The code words may indicate incremental step sizes (stride length). Alternatively, the stride length may be non-uniform step sizes, for example, a coarse stride length (larger) and a fine stride length (smaller). Or, the stride length may follow a step size that is based on a successive approximation method in which the stride length may be a value to move the actuator to a middle of the expected remainder of actuator 460 displacement.

The digital-to-analog converter (DAC) 440 may convert a control signal (DAC code word) received from the control logic 410 into an analog voltage.

The amplifier 450 may receive the analog voltage output from the DAC 440, and amplify it to a voltage that drives the actuator 460. Optionally, the amplifier gain may be a dynamically-assigned parameter, which can be stored in the registers 452, 454.

The capacitance sensor 430 may have inputs for receiving feedback from the actuator 460 to sense a signal that is used to determine the capacitance of the actuator, and a communication path for communicating with control logic 410. Any of the variety of capacitance sensors may be used pursuant to the present invention, one exemplary capacitance sensor is described below in connection with FIG. 5 below.

The actuator 460 may be any of a plurality of different types of actuators such as MEMS devices and the like. For example, an actuator may be similar to the MEMS device described in commonly-assigned U.S. patent application Ser. No. 12/338,767 entitled "Micro-Electro-mechanical Switch Beam Construction with Minimized Beam Distortion and Method for Constructing", the entire contents of which are incorporated herein by reference. In an implementation of an actuator 460 that is a MEMS device, the MEMS device may be manufactured on a common integrated circuit as the driver 400. If the actuator may be, for example, a MEMS device, and/or may be provided as a component external to the integrated circuit in which the driver resides. The actuator capacitance may change due to the position, device orientation and environmental temperature of the actuator.

During operation, in the driver 400, the control logic 410 may assert an initial control signal having a digital code word to the DAC 440 in order to move the actuator to a first extreme position. The DAC 440 may convert the digital code word into an analog voltage signal, and outputs the analog voltage signal to the amplifier 450. The amplifier 450 amplifies the analog voltage signal from the DAC 440 and applies an amplified voltage to the actuator 460. The actuator 460 moves a distance according to the applied amplified voltage.

The capacitance sensor 430 may respond to a feedback signal obtained from the driver 400 connections to the actuator 460. Based on the feedback signal, a value representative of the capacitance of the actuator 460 may be obtained. A next digital code word may be applied to the DAC 440, which may convert the digital code word to a voltage that may be applied to the actuator 460 as explained above. The next digital code word may be a preprogrammed incremental change from the initial code word. Alternatively, the change may be variable based on time, or orientation of the IC chip hosting the driver 400.

The representative capacitance value of the actuator 460 may be determined for the next digital code word. The representative capacitance value due to the next digital code word may be compared to the representative capacitance value due to the initial code word to determine if the capacitance value has changed within a predetermined tolerance of a threshold capacitance value from the assertion of the initial code word to assertion of the next digital code word.

If a change in the capacitance value greater than a threshold capacitance value has occurred, a value representative of the preceding code word (which in this case would be the initial code word) may be stored in the register 452 as Vmax. Otherwise, another digital code word may be asserted by control logic 410, and the measuring by capacitance sensor 430 and determination by control logic 410 of whether a change in capacitance value does occur continues. Once the value of voltage Vmax is determined, another digital code word may be asserted by the control logic 410. The capacitance sensor 430 senses the capacitance of the actuator, and outputs a present value representative of the capacitance of the actuator 460 to the control logic 410.

Using a previous value representative of the capacitance of the actuator 460 and the present value, a determination of whether the capacitance has NOT changed by a threshold capacitance value may be made. If a change by a threshold capacitance value has NOT occurred, a value representative of the preceding code word (which in this case would be the previous code word) may be stored in the register 454 as Vmin. Otherwise, another digital code word may be asserted by control logic 410, and the measuring by capacitance sensor 430 and determination by control logic 410 of whether a change by a threshold capacitance value does NOT occur continues.

Figure 5:
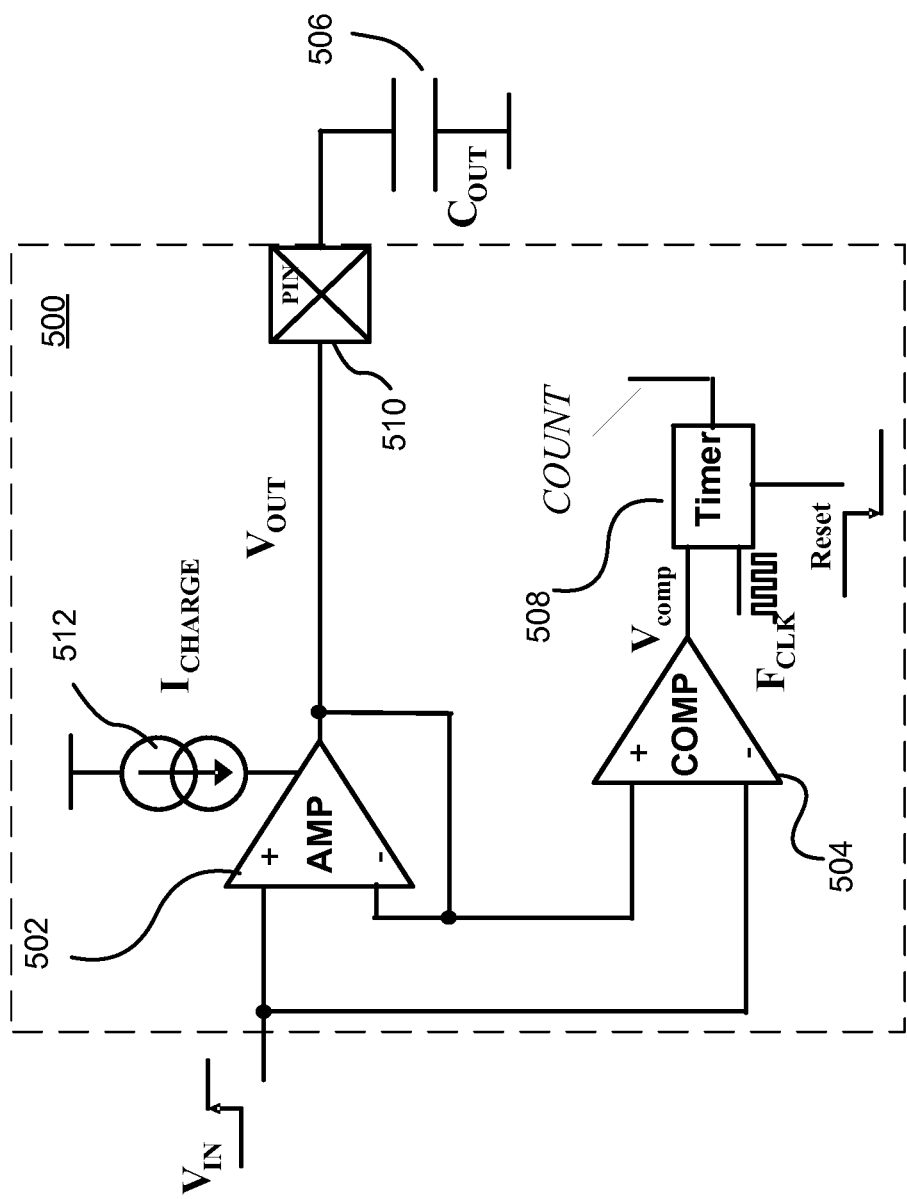
FIG. 5 is a schematic diagram of an exemplary capacitance sensing circuit that may be used to measure capacitance in accordance with an embodiment of the present invention.

This process can be executed at various times, or when a condition, such as changes to the orientation, temperature, or some other condition or combination of conditions, of the device containing the IC chip hosting the driver 400 is determined to have changed. The threshold capacitance value may change based on the conditions FIG. 5 is a schematic diagram of a capacitance sensing circuit 500 that may be used to measure capacitance in accordance with an exemplary embodiment of the present invention.

The circuit 500 may be implemented on an IC chip for incorporation into a device, such as a cellular telephone, camera or the like. The capacitance sensing circuit 500 may generate a COUNT value representing the capacitance value of the actuator. The capacitance sensing circuit 500 may be hosted on an integrated chip, and may be connected to an actuator 506, which may be modeled as a capacitor.

The circuit 500 can include an amplifier 502, a comparator 504 and a timer 508. The amplifier 502 may generate an output voltage that is applied to an output pin 510. The comparator 504 may compare the voltage applied to the output pin 510 to a reference voltage.

An actuator 506 may be coupled to the IC chip 500 via the pin 510, and may be any type of actuator suitable for use with the capacitance sensing circuit 500.

The amplifier 502 may take an input signal VIN at one input pin and take the output voltage VOUT at another input pin via a feedback path. The output voltage VOUT may match the input voltage VIN with a response delay. In this embodiment, a charge current may be provided by the output current of the amplifier 502, which may be controlled by a current source 512. The current source 512 may provide a constant charge current ICHARGE to the output electrical current of the amplifier 502. Alternatively, the amplifier 502 may be a voltage output amplifier, and output a voltage signal.

The comparator 504 and timer 508 may estimate the response time for the actuator 506 coupled to the pin 510 to be charged to a certain voltage. The capacitance of the actuator 506 may be determined by the response delay for output voltage VOUT to match the input voltage VIN. The reference voltage, in this embodiment, used by the comparator 504 may be the input voltage VIN. The output signal VCOMP of the comparator 504 may be coupled to an input pin of the timer 508. Another input pin of the timer 508 may be coupled to a clock signal FCLK. Thereby, the timer 508 may count the response time (e.g., the response delay) for the output voltage VOUT to match the input voltage VIN. Thus, in one embodiment, the output voltage VOUT may be compared with the input voltage VIN directly. In one or more embodiments, the output signal VOUT may be connected to the input pin of the comparator 504 directly.

Figure 6:
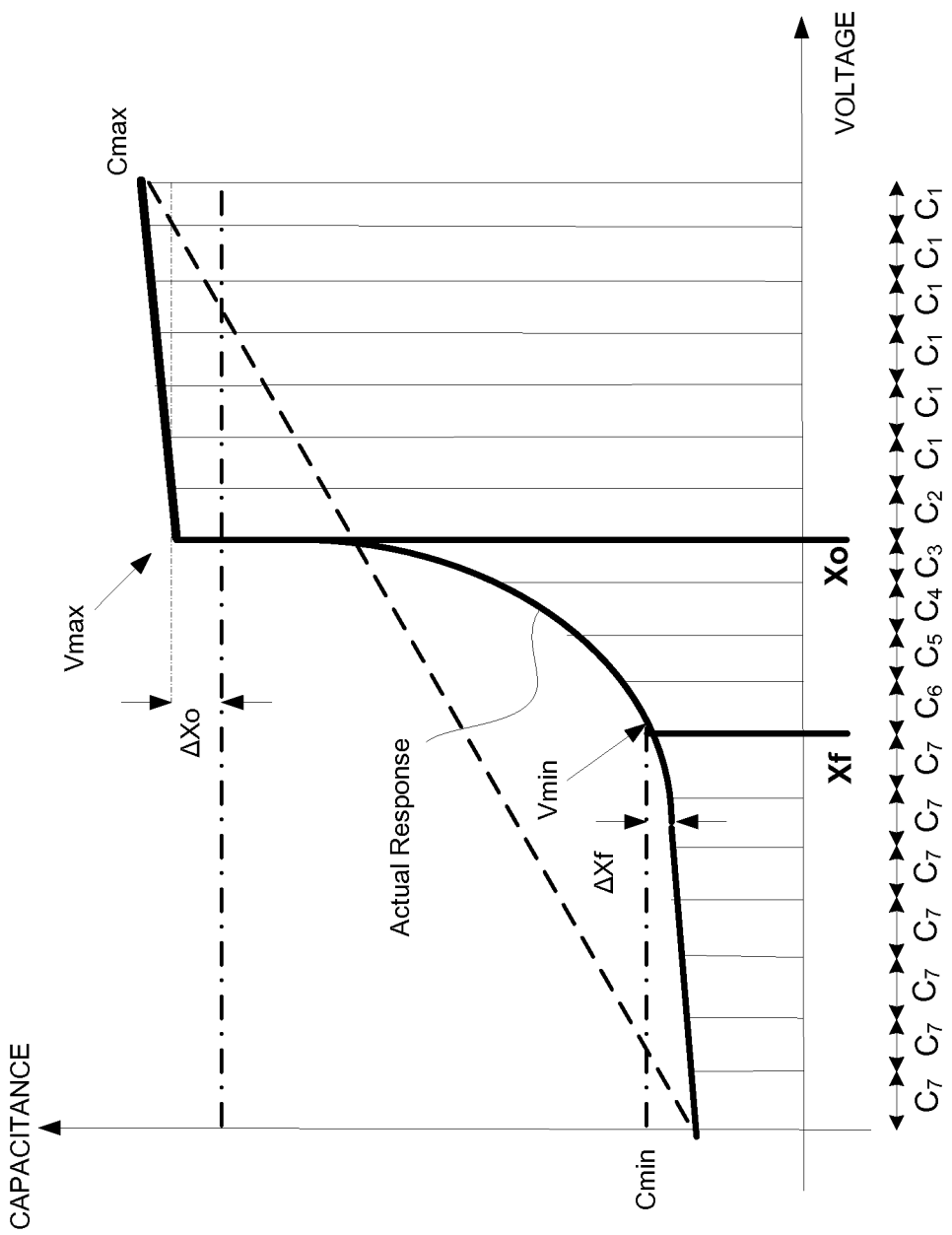
FIG. 6 is an illustration of an exemplary response curve in accordance with an embodiment of the present invention.

Alternatively, as shown in FIG. 6, using the count value, a representation of the capacitance value of the actuator 506 may be determined. In other words, the value of capacitance Cout may be translated into a counter reading COUNT. The determination of whether the capacitance of an actuator has changed by a predetermined amount can be made based on a direct comparison of the count values representative of the capacitance of the actuator, i.e. COUNT(1)≅COUNT(2). The counter reading COUNT may have a predetermined tolerance added to allow for errors within the capacitance sensing circuitry that may affect the count value.

Or, when determining Vmax, the determination of a change in capacitance can be made by performing an operation, such as COUNT(1)−COUNT(2)>ΔXo, where ΔXo is a predetermined amount of change in capacitance that represents an acceptable amount of change. Also, based on conditions, such as orientation, time and/or temperature, ΔXo may variable. ΔXo may also be programmable. As shown in FIG. 6, the COUNTS shown as C1-C7 do not begin to change until the actual response curve of the actuator. When the representative count value exceeds ΔXo, the COUNT increments to C2, then C3, then C4 until C7 and the Vmin point is reached.

Similarly, when determining Vmin, the determination of a change in capacitance has NOT occurred can be made by performing an operation, such as COUNT(1)−COUNT(2) <ΔXf, where ΔXf is a predetermined amount of tolerance in capacitance that represents a threshold for acceptable amount of error. Also, based on conditions, the tolerance ΔXf may be variable. Tolerance ΔXf may also be programmable. Once the Vmin point is reached, the COUNT C7 does not increase.

As shown in FIG. 6 below, the response curve may be stepped through in voltage intervals, and the deltas (and ΔXf) may have a tolerance programmed in that allows less precision in the capacitance measurements. Note that capacitance is proportional to displacement.

Several features and aspects of the present invention have been illustrated and described in detail with reference to particular embodiments by way of example only, and not by way of limitation. Those of skill in the art will appreciate that alternative implementations and various modifications to the disclosed embodiments are within the scope and contemplation of the present disclosure. For example: Tolerances may be included in the capacitance measurements or used in the determination whether a capacitance value has changed, or both. The tolerances used in the determination process or measurement process, which account for error, may be pre-programmed independently of each other from an external source. Additionally, other types of decision logic can be used to determine the capacitance of an actuator. For example, a successive approximation register (SAR) may be used to find points Vmax and Vmin of an actuator response curve. This approach may require more accurate measurements.

We claim:

1. A method for determining a response curve of an actuator, comprising:
applying one of a maximum or minimum magnitude signal causing an actuator to move to a first extreme position;
at the first extreme position, measuring, by a capacitance sensing circuit, an initial capacitance of the actuator;
applying a signal to move the actuator a predetermined increment to a next position that is toward a second extreme position;
measuring the capacitance of the actuator at the next position;
determining whether the capacitance measured at the next position has changed by a first threshold amount from the measured initial capacitance;
if a result of the determining indicates the capacitance changed by the first threshold amount, recording the signal value preceding the applied signal that caused the actuator to move as an indicator of a first threshold position related to the first extreme position, the first threshold position corresponding to a first end of the actuator response curve;
repeating applying a signal to move the actuator a predetermined incremental toward the second extreme position, wherein the second extreme position corresponds to applying the other of the maximum or minimum magnitude signal applied to move to the first extreme position;
repeating the measuring of the capacitance of the actuator after each move until it is determined that the capacitance has not changed by a second threshold amount from a previous measurement;
repeating the determining of the capacitance until it is determined that the capacitance has not changed by the second threshold amount, recording the signal value related to the previously measured capacitance as a second threshold position related to the second extreme position, the second threshold position corresponding to second end of the actuator response curve.

2. The method of claim 1, wherein the predetermined increment remains constant for each iteration of the repeated applying step.

3. The method of claim 1, wherein the predetermined increment varies during iterations of the repeated applying step.

4. The method of claim 1, wherein a stride length remains constant for each iteration of the repeated applying step.

5. The method of claim 1, wherein a stride length varies during iterations of the repeated applying step.

6. The method of claim 1, wherein measuring the capacitance, comprises:
counting a response time until an output voltage of the capacitance sensing circuit matches an input voltage representative of the applied signal.

7. The method of claim 1, wherein the change in the capacitance of the actuator is determined using a counter value.

8. The method of claim 1, wherein the applied signal is a digital code.

9. The method of claim 1, wherein the first threshold amount is a constant value.

10. The method of claim 1, wherein the first threshold amount is a variable value.

11. The method of claim 1, wherein the second threshold amount is a constant value.

12. The method of claim 1, wherein the second threshold amount is a variable value.

13. The method of claim 1, wherein the applying, measuring and determining occur on an integrated circuit chip.

14. An apparatus for characterizing a response curve of an actuator comprising:
a memory device for storing values related to actuator capacitance in response to signals from a control logic;
a capacitance sensor including circuitry for determining a signal representative of the capacitance of the actuator; and
control logic configured to:
send output signals to the actuator to cause the actuator to move initially from a first extreme position,
receive signals from the capacitance sensor, determine if the capacitance of the actuator has changed by a first threshold amount, if the capacitance has changed by the first threshold amount, cause a value of the signal related to the determined first threshold capacitance change to be stored in the memory device corresponding to a first end of the actuator response curve, send output signals to the actuator to cause the actuator to move incrementally towards a second extreme position, receive signals from the capacitance sensor, determine if the capacitance of the actuator has not changed by a second threshold amount from a previous measurement correspond to a second threshold amount, and if the capacitance has not changed by the second threshold amount, cause a value of the signal related to the determined second threshold capacitance change to be stored in the memory device corresponding to a second end of the actuator response curve.

15. The apparatus of claim 14, wherein the actuator driver and the capacitance sensor are on an integrated circuit chip.

16. The apparatus of claim 14, wherein the capacitance sensor comprises:
- an amplifier for receiving an input signal and outputting an output signal;
- a comparator for comparing the input signal and the output signal; and
- a timer for counting the time until the input signal and the output signal are substantially the same.

17. The apparatus of claim 14, comprising:
- a digital-to-analog converter for converting the output signal from a digital signal to an analog signal.

18. The apparatus of claim 14, wherein the memory device comprises a register for storing a value of a maximum voltage and a value for a minimum voltage.

19. The apparatus of claim 14, wherein the first threshold amount is a first capacitance value and the second threshold amount is a second capacitance value.

* * * * *